United States Patent
Bettin et al.

(10) Patent No.: US 7,576,665 B2
(45) Date of Patent: Aug. 18, 2009

(54) SYSTEM AND METHOD FOR RECEIVING ANALOG AND DIGITAL INPUT

(75) Inventors: Mark Bettin, Murphy, TX (US); Philip Buchholz, Keller, TX (US)

(73) Assignee: AMX LLC, Richardson, TX (US)

( * ) Notice: Subject to any disclaimer, the term of this patent is extended or adjusted under 35 U.S.C. 154(b) by 0 days.

(21) Appl. No.: 11/945,430

(22) Filed: Nov. 27, 2007

(65) Prior Publication Data

US 2009/0135034 A1    May 28, 2009

(51) Int. Cl.
    *H03M 1/00* (2006.01)
(52) U.S. Cl. .................. 341/110; 341/132; 341/139; 341/141; 341/142; 341/155
(58) Field of Classification Search .............. 341/110, 341/132, 139, 141, 143, 144, 155
    See application file for complete search history.

(56) References Cited

U.S. PATENT DOCUMENTS

| | | | | |
|---|---|---|---|---|
| 5,668,339 | A | * | 9/1997 | Shin .......................... 84/634 |
| 5,841,387 | A | * | 11/1998 | VanBuskirk ................. 341/155 |
| 6,009,165 | A | * | 12/1999 | Karnowski ............. 379/388.01 |
| 6,185,627 | B1 | * | 2/2001 | Baker et al. .................... 710/1 |
| 6,862,636 | B2 | * | 3/2005 | Young .......................... 710/69 |
| 6,973,431 | B2 | * | 12/2005 | Cooper et al. ................ 704/503 |
| 7,184,794 | B2 | * | 2/2007 | Hess et al. ................... 455/559 |
| 7,298,765 | B2 | * | 11/2007 | Ganton et al. ............... 370/537 |
| 7,368,951 | B2 | * | 5/2008 | Iwasaki ........................ 326/86 |
| 7,394,406 | B2 | * | 7/2008 | Pasqualino ................... 341/50 |
| 2003/0098805 | A1 | * | 5/2003 | Bizjak .......................... 341/139 |
| 2004/0228369 | A1 | * | 11/2004 | Simmons, III ............. 370/537 |
| 2004/0239542 | A1 | * | 12/2004 | Olson et al. ................. 341/143 |

* cited by examiner

*Primary Examiner*—Linh V Nguyen
(74) *Attorney, Agent, or Firm*—Gardere Wynne Sewell LLP; Karl L. Larson

(57) ABSTRACT

A system and a method are provided for receiving analog and digital audio input via a single audio input connector. The method includes receiving an input signal from a single audio input connector, splitting the received input signal into a first input signal and a second input signal, filtering the first input signal to pass a digital signal, filtering the second input signal to pass an analog signal, digitizing the filtered analog signal, and multiplexing the filtered digital signal and the filtered digitized analog signal.

20 Claims, 10 Drawing Sheets

SYSTEM AND METHOD FOR RECEIVING ANALOG AND DIGITAL INPUT

BACKGROUND OF THE INVENTION

1. Field of the Invention

The present invention is generally related to receiving audio signals, and more particularly to a system and method for receiving analog and/or digital audio input via a single audio input connector.

2. Discussion of the Background

Currently, analog and digital inputs for various electronic components each have a separate connector or share a connector coupled to a switch that must manually be positioned to indicate whether an analog input or a digital input is present. Such a duplication of input connectors and the need for a manual selection mechanism when utilizing a single input connector increases the cost and complexity of the electronic components such as audio/video equipment, stereo equipment, home automation equipment, computer equipment, remote control equipment, and the like. However, such duplication is necessary in the prior art due to differences between analog and digital inputs. Notably, analog and digital inputs require different impedance at the input connector and operate at different frequencies.

Thus, as noted above, there currently exists deficiencies in receiving analog and/or digital audio input in the prior art.

SUMMARY OF THE INVENTION

Accordingly, one aspect of the present invention is to provide a method for receiving analog and digital audio input via a single audio input connector. The method includes receiving an input signal from a single audio input connector, splitting the received input signal into a first input signal and a second input signal, filtering the first input signal to pass a digital signal, filtering the second input signal to pass an analog signal, digitizing the filtered analog signal, and multiplexing the filtered digital signal and the filtered digitized analog signal.

Another aspect of the present invention is to provide a system for receiving analog and digital audio input via a single audio input connector. The system includes a single audio input connector that receives an input signal, a low impedance filter that filters the input signal to pass digital signal components of the input signal, a high impedance filter that filters the input signal to pass analog signal components of the input signal, a digitizer that digitizes the high impedance filtered analog signal components, and a multiplexer that multiplexes the low impedance filtered digital signal components and the digitized high impedance filtered analog signal components. The low impedance filter is communicably connected to the single audio input connector. The high impedance filter is communicably connected to the single audio input connector. The digitizer is communicably connected to the high impedance filter. The multiplexer is communicably connected to the low impedance filter and the multiplexer is communicably connected to the digitizer.

Yet another aspect of the present invention is to provide a system for receiving analog and digital audio input via a single audio input connector. The system includes a single input connector, and a high pass filter configured to receive an input signal from the signal input connector. The input signal includes an analog input signal or a digital input signal. The analog input signal is an input signal that is below a cut-off frequency of the high pass filter and follows a low frequency output path. The digital input signal is an input signal that is a low impedance input and follows a high frequency output path.

BRIEF DESCRIPTION OF THE DRAWINGS

A more complete appreciation of the present invention and many of the attendant advantages thereof will be readily obtained as the same becomes better understood by reference to the following detailed description when considered in conjunction with the accompanying drawings, wherein.

DETAILED DESCRIPTION THE PREFERRED EMBODIMENTS

Figure 1:
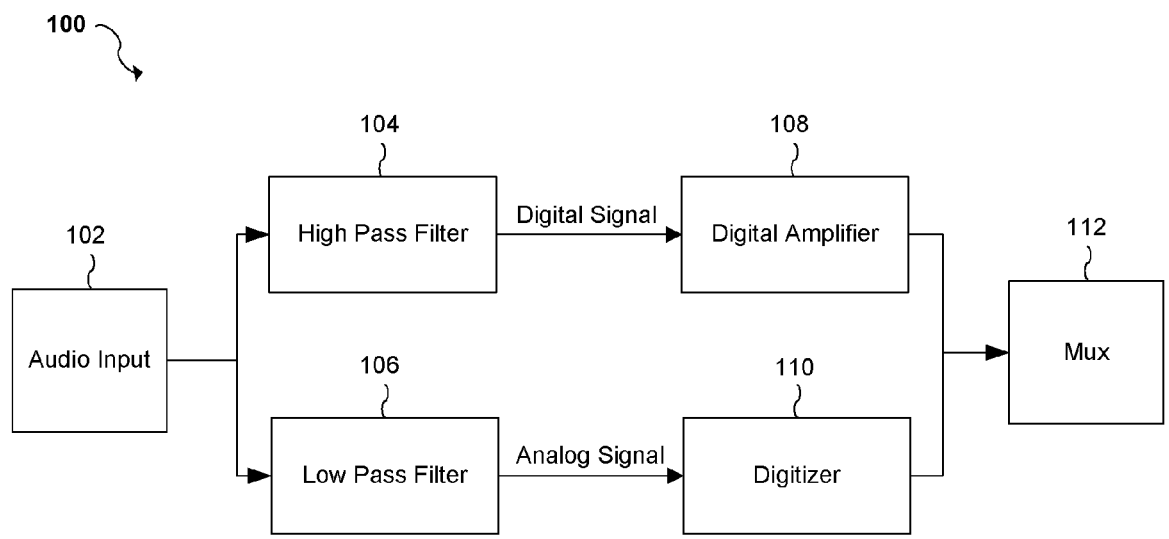
FIG. 1 is a block diagram illustrating a system for receiving analog and digital audio input in accordance with an embodiment of the present invention.

Referring now to the drawings, wherein like reference numerals designate identical or corresponding parts throughout the several views, preferred embodiments of the present invention are described.

The present invention provides analog and/or digital audio input via a single audio input connector for an electronic circuit. However, analog and digital inputs require different impedance at the input connector and operate at different frequencies. For instance, typical sources of analog audio signals provide an input signal in a low frequency range (e.g., below 100 kHz), whereas typical sources of digital audio signals provide an input signal in a high frequency range (e.g., above 100 kHz). Further, the impedance of an analog input is typically higher than the impedance of a digital input (e.g., 75 Ohms). According to at least one embodiment of the present invention, when receiving digital input, the single audio input connector provides a predetermined characteristic impedance, such as 75 Ohms, which corresponds to the characteristic impedance of typical sources of audio signals in a digital format.

Referring to FIG. 1, a block diagram illustrating a system for receiving analog and digital audio input in accordance with an embodiment of the present invention is shown. According to this embodiment, the system 100 includes an audio input arrangement that allows either an analog input or a digital input to be received by an electronic component via a single audio input connector 102. A high pass filter 104 filters digital input signals from digital audio components, and a low pass filter 106 filters analog signals from analog audio components. The high pass filtered digital signals are amplified by a digital signal amplifier 108. The low pass filtered analog signals are digitized by a digitizer 110. The high pass filtered amplified digital signal and the digitized analog signal are multiplexed by a multiplexer 112. This arrangement allows an electronic component, such as a digital audio device, to receive a digital signal while an analog audio digitizer can receive an analog audio signal.

The described and depicted blocks or modules of the system 100 may be implemented by means of, without limitation, software, hardware, firmware and/or the combination thereof. The transfer of input signals between the various blocks or modules in the system 100 may be implemented by means of, without limitation, a wireless protocol, a wired protocol or a combination thereof. Further, the various blocks or modules in the system 100 may be directly or indirectly communicably connected. The described and depicted blocks or modules of the system 100 preferably form a circuit. However, in certain situations and/or applications the system 100 may not form a circuit.

Figure 2:
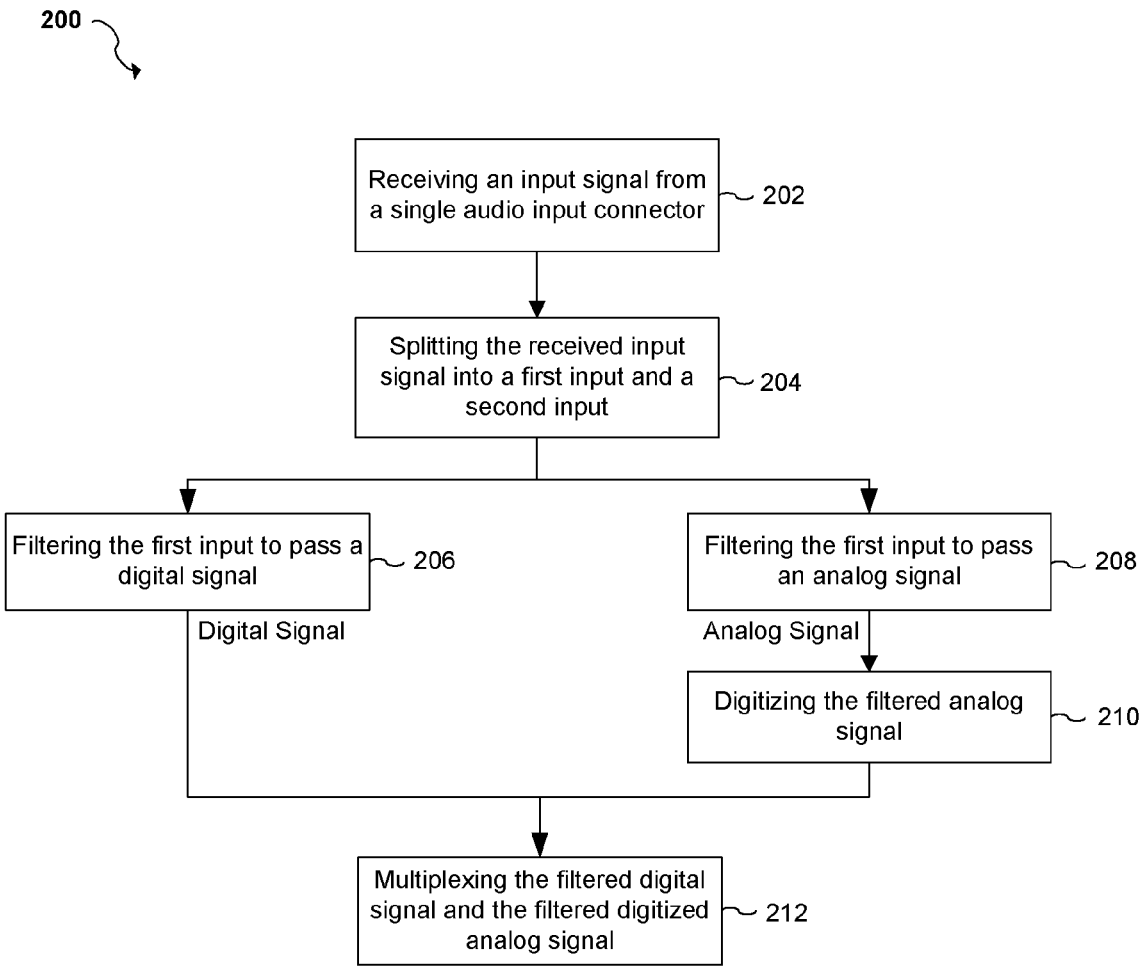
FIG. 2 is a flowchart illustrating a method for receiving analog and digital audio input in accordance with an embodiment of the present invention.

Referring to FIG. 2, a flowchart illustrating a method for receiving analog and digital audio input in accordance with an embodiment of the present invention is shown. According to this embodiment, an input signal is received from a single audio input connector, as shown at block 202. At block 204, the received input signal is split into first and second input signals, respectively. The first input signal is filtered to pass a digital signal, as shown at block 206. The second input signal is filtered to pass an analog signal, as shown at block 208. At block 210, the filtered analog signal is digitized. The filtered digital signal and the filtered digitized analog signal are processed by a multiplexer, as shown at block 212. The method 200 may be implemented by means of, without limitation, software, hardware, firmware and/or the combination thereof. The transfer of input signals may be implemented by means of, without limitation, a wireless protocol, a wired protocol or a combination thereof.

Figure 3:
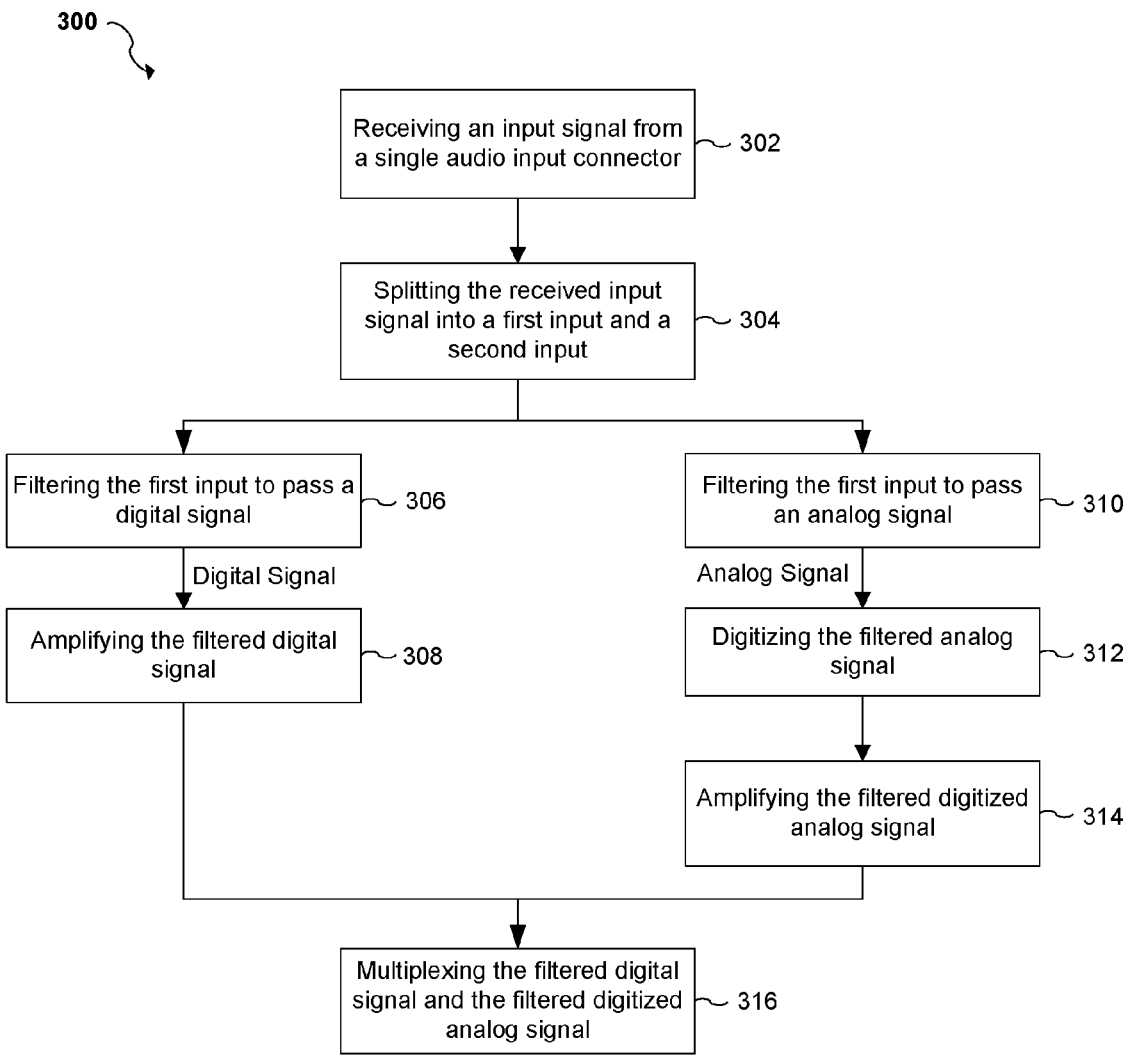
FIG. 3 is a flowchart illustrating a second method for receiving analog and digital audio input in accordance with an embodiment of the present invention.

Referring to FIG. 3, a flowchart illustrating a second method for receiving analog and digital audio input in accordance with an embodiment of the present invention. According to this embodiment, an input signal is received from a single audio input connector, as shown at block 302. At block 304, the received input signal is split into first and second input signals, respectively. The first input signal is filtered to pass a digital signal, as shown at block 306. The filtered digital signal is then amplified, as shown at block 308. The second input signal is filtered to pass an analog signal, as shown at block 310. At block 312, the filtered analog signal is digitized. The filtered analog signal is then amplified, as shown at block 314. The filtered digital signal and the filtered digitized analog signal are processed by a multiplexer, as shown at block 316.

The digitizing of the filtered analog signal is performed by a digitizer. The filtering of the first input signal is performed by a high pass filter. The filtering of the first input signal is performed by a low impedance filter. The filtering of the second input is performed by a low pass filter. The filtering of the second input is performed by a high impedance filter.

The method 300 may be implemented by means of, without limitation, software, hardware, firmware and/or the combination thereof. The transfer of input signals may be implemented by means of, without limitation, a wireless protocol, a wired protocol or a combination thereof.

Figure 4:
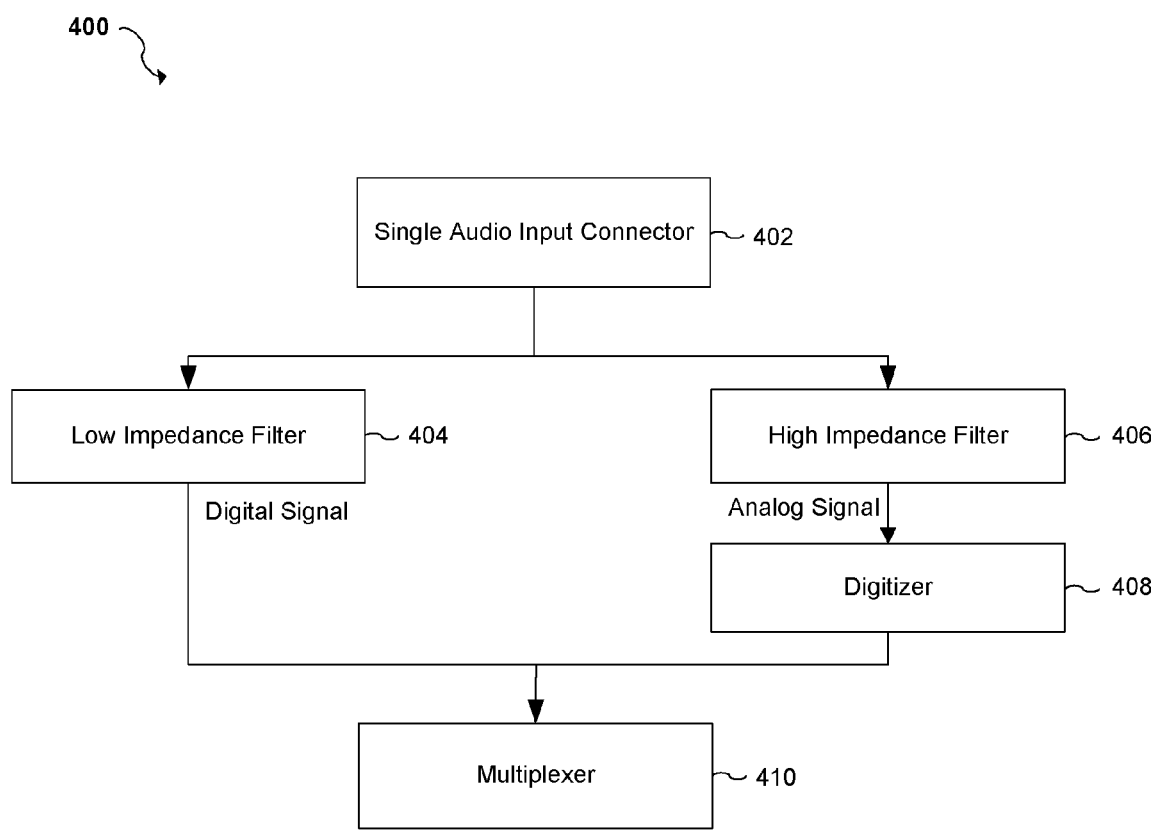
FIG. 4 is a block diagram illustrating a second system for receiving analog and digital audio input in accordance with an embodiment of the present invention.

Referring to FIG. 4, a block diagram illustrating a second system for receiving analog and digital audio input in accordance with an embodiment of the present invention is shown. According to this embodiment, the system 400 includes an audio input arrangement that allows either an analog input or a digital input to be received by an electronic component via a single audio input connector 402. A low impedance filter 404, communicably connected to the single audio input connector 402, filters digital input signals from digital audio components. A high impedance filter 406, communicably connected to the single audio input connector 402, filters analog signals from analog audio components. The high impedance filtered analog signals are digitized by a digitizer 408. The digitizer 408 is communicably connected to the high impedance filter 406. The low impedance filtered digital signal and the digitized analog signal are multiplexed by a multiplexer 410. The multiplexer is communicably connected to the digitizer 408 and the low impedance filter 404.

The described and depicted blocks or modules of the system 400 may be implemented by means of, without limitation, software, hardware, firmware and/or the combination thereof. The transfer of input signals between the various blocks or modules in the system 400 may be implemented by means of, without limitation, a wireless protocol, a wired protocol or a combination thereof. Further, the various blocks or modules in the system 400 may be directly or indirectly communicably connected. The described and depicted blocks or modules of the system 400 preferably form a circuit. However, in certain situations and/or applications the system 400 may not form a circuit.

Figure 5:
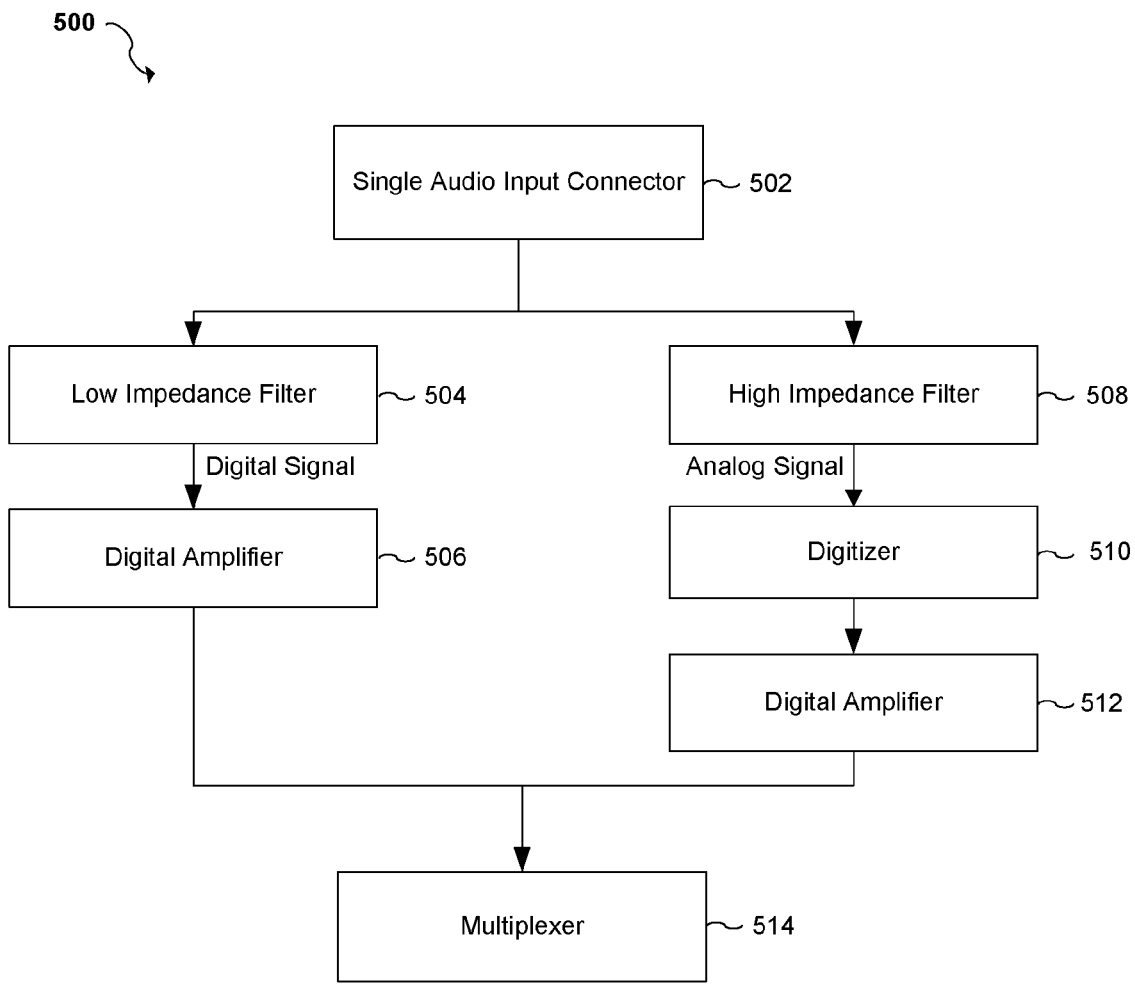
FIG. 5 is a block diagram illustrating a third system for receiving analog and digital audio input in accordance with an embodiment of the present invention.

Referring to FIG. 5, a block diagram illustrating a third system for receiving analog and digital audio input in accordance with an embodiment of the present invention is shown. According to this embodiment, the system 500 includes an audio input arrangement that allows either an analog input or a digital input to be received by an electronic component via a single audio input connector 502. A low impedance filter 504, communicably connected to the single audio input connector 502, filters digital input signals from digital audio components. A digital amplifier 506, communicably connected to the low impedance filter 504, amplifies the low impedance filtered digital signals. A high impedance filter 508, communicably connected to the single audio input connector 502, filters analog signals from analog audio components. The high impedance filtered analog signals are digitized by a digitizer 510. The digitizer 510 is communicably connected to the high impedance filter 508. A digital amplifier 512, communicably connected to the digitizer 510, amplifies the high impedance filtered digitized analog signals. According to one possible configuration, the low impedance filter 504 is a high pass filter that filters digital signals having a frequency greater than around 100 KHz, and the high impedance filter 508 is a low pass filter that filters analog signals having a frequency less than around 100 kHz. However, other low impedance filter and high impedance filter frequencies are possible within the scope of the present invention. The low impedance filtered digital signal and the digitized analog signal are multiplexed by a multiplexer 514. The multiplexer is communicably connected to the digitizer 512 and the digital amplifier 506.

The described and depicted blocks or modules of the system 500 may be implemented by means of, without limitation, software, hardware, firmware and/or the combination thereof. The transfer of input signals between the various blocks or modules in the system 500 may be implemented by means of, without limitation, a wireless protocol, a wired protocol or a combination thereof. Further, the various blocks or modules in the system 500 may be directly or indirectly communicably connected. The described and depicted blocks or modules of the system 500 preferably form a circuit. However, in certain situations and/or applications the system 500 may not form a circuit.

Figure 6:
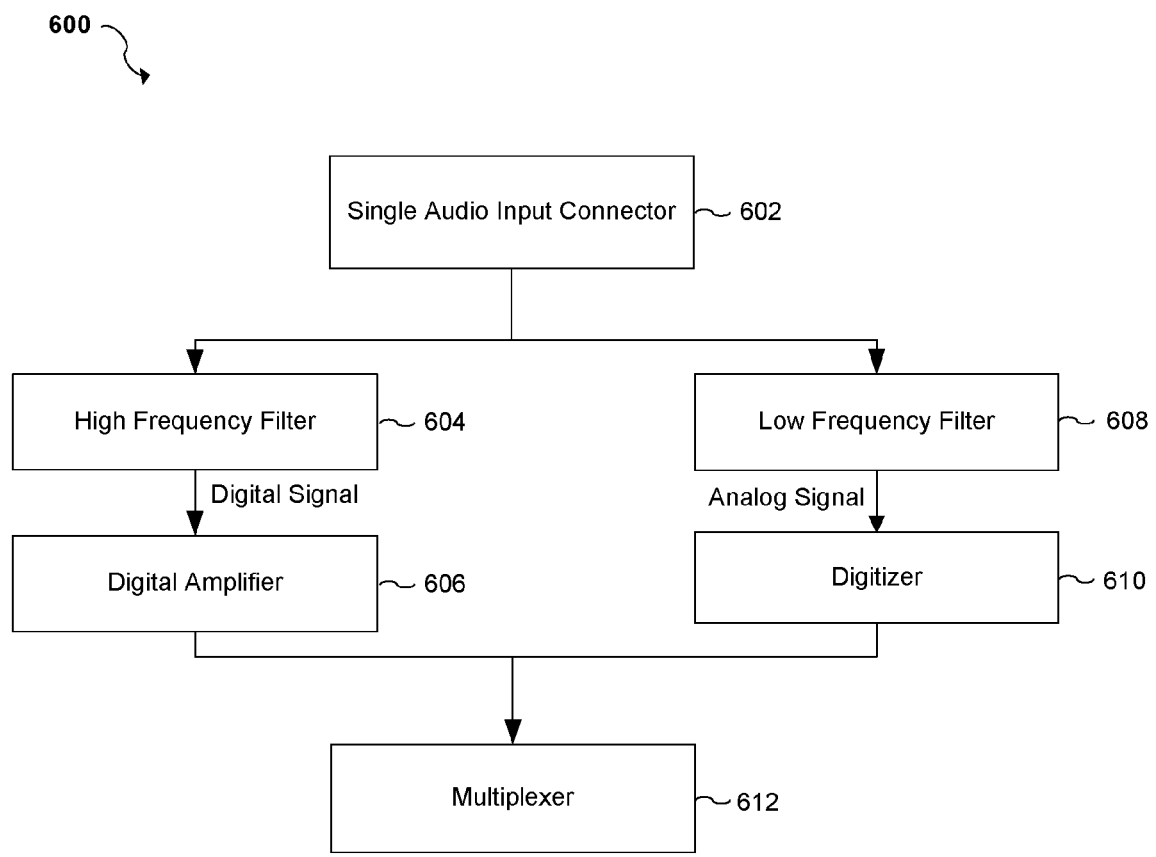
FIG. 6 is a block diagram illustrating a fourth system for receiving analog and digital audio input in accordance with an embodiment of the present invention.

Referring to FIG. 6, a block diagram illustrating a fourth system for receiving analog and digital audio input in accordance with an embodiment of the present invention is shown. According to this embodiment, the system 600 includes an audio input arrangement that allows either an analog input or a digital input to be received by an electronic component via a single audio input connector 602. A high frequency filter 604, communicably connected to the single audio input connector 602, filters digital input signals from digital audio components. In one possible configuration, high frequency filter 604 filters frequencies greater than around 100 kHz. However, other high frequency filter frequencies are possible within the scope of the present invention. A digital amplifier 606, communicably connected to the high frequency filter 604, amplifies the high frequency filtered digital signals. A low frequency filter 608, communicably connected to the single audio input connector 602, filters analog signals from analog audio components. In one possible configuration, low frequency filter 608 filters frequencies up to 100 kHz. However, other low frequency filter frequencies are possible within the scope of the present invention. The low frequency filtered analog signals are digitized by a digitizer 610. The digitizer 610 is communicably connected to the high impedance filter 608.

The high frequency filter 604 may be implemented by means of, without limitation, a high pass filter, a band pass filter, a passive filter, an active filter or a combination thereof. The low frequency filter 608 may be implemented by means of, without limitation, a low pass filter, a band pass filter, a passive filter, an active filter or a combination thereof.

The described and depicted blocks or modules of the system 600 may be implemented by means of, without limitation, software, hardware, firmware and/or the combination thereof. The transfer of input signals between the various blocks or modules in the system 600 may be implemented by means of, without limitation, a wireless protocol, a wired protocol or a combination thereof. Further, the various blocks or modules in the system 600 may be directly or indirectly communicably connected. The described and depicted blocks or modules of the system 600 preferably form a circuit. However, in certain situations and/or applications the system 600 may not form a circuit.

Figure 7:
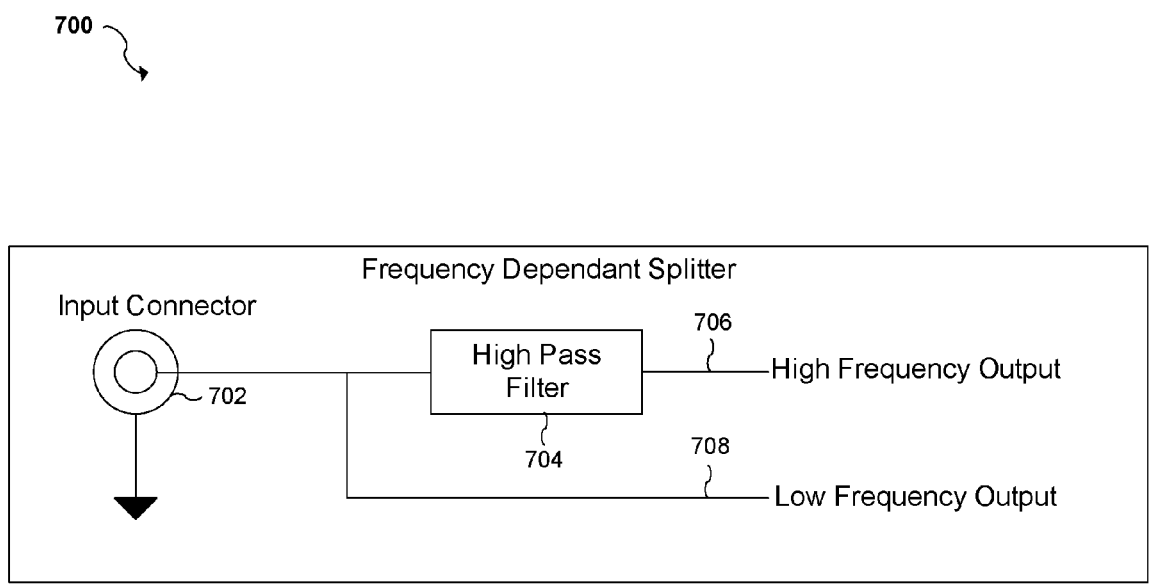
FIG. 7 is a block diagram illustrating a fifth system for receiving analog and digital audio input in accordance with an embodiment of the present invention.

Referring to FIG. 7, a block diagram illustrating a fifth system for receiving analog and digital audio input in accordance with an embodiment of the present invention is shown. According to this embodiment, the system 700 includes a single input connector 702 that receives an input and a high pass filter 704 that outputs high frequencies related to the received input. The system 700 provides a frequency based de-multiplexer with two outputs 706 and 708. One output consists of a high frequency portion 706 of the input and the other output consists of a low frequency portion 708 of the input. According to one possible configuration, high frequency portion of the input is a frequency greater than around 100 KHz, and the low frequency portion of the input is a frequency less than around 100 kHz. However, other frequencies are possible within the scope of the present invention.

Figure 10:
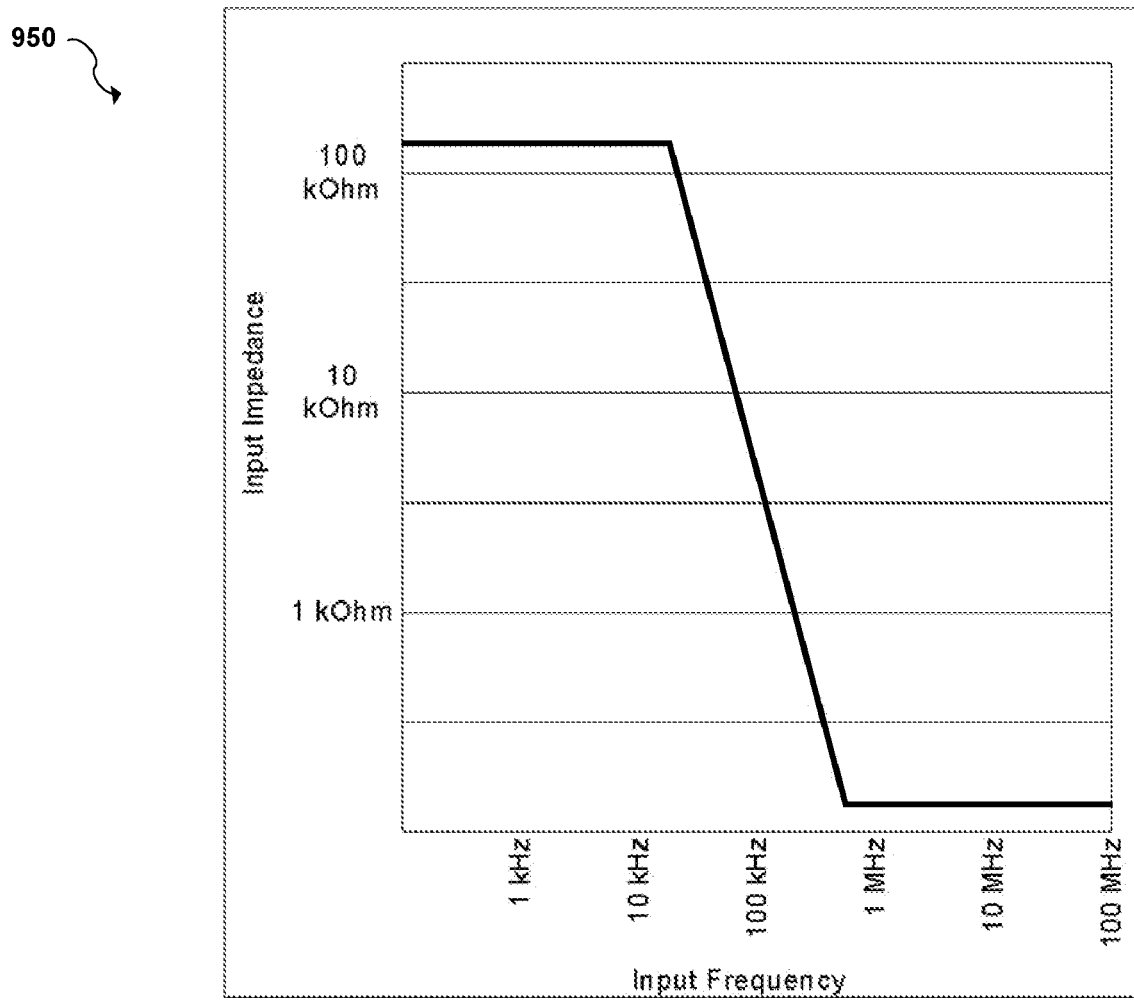
FIG. 10 is a chart illustrating an exemplary impedance profile of the analog and digital audio input in accordance with an embodiment of the present invention.

One consideration involves the manner in which the input impedance of the splitter function (described above) appears to the input connector 702. The input connector should experience a variable input impedance. For example, in the audio range of potential frequencies, if the input is high impedance and above the audio frequency range, the input impedance drops to a value of 75 Ohms. According to one possible configuration, the high pass filter 704 accomplishes this task as the filter is set at 75 Ohms in the pass band. The low frequency output 708 would be tapped off the input side of the high pass filter 704 and the high frequency output 706 would be tapped off the output side of the high pass filter 704. Thus, the natural input impedance of the high pass filter 704 will give the necessary variable input impedance profile needed. For example, FIG. 10 shows one possible impedance profile of the analog and digital audio input in accordance with an embodiment of the present invention.

According to this embodiment, when an audio signal is received by the input connector 702, it will experience the high input impedance it desires because the signal will be below the high pass filter's 704 cut off frequency and thus it will take the only path available which would consist of the low frequency output path 708. However, when a high frequency digital signal is present on the input connector 702, the high pass filter 704 appears as a low impedance 75 Ohm input and the digital signal will take the high frequency output path 706 out of the splitter.

The described and depicted blocks or modules of the system 700 may be implemented by means of, without limitation, software, hardware, firmware and/or the combination thereof. The transfer of input signals between the various blocks or modules in the system 700 may be implemented by means of, without limitation, a wireless protocol, a wired protocol or a combination thereof. Further, the various blocks or modules in the system 700 may be directly or indirectly communicably connected. The described and depicted blocks or modules of the system 700 preferably form a circuit. However, in certain situations and/or applications the system 700 may not form a circuit.

Figure 8:
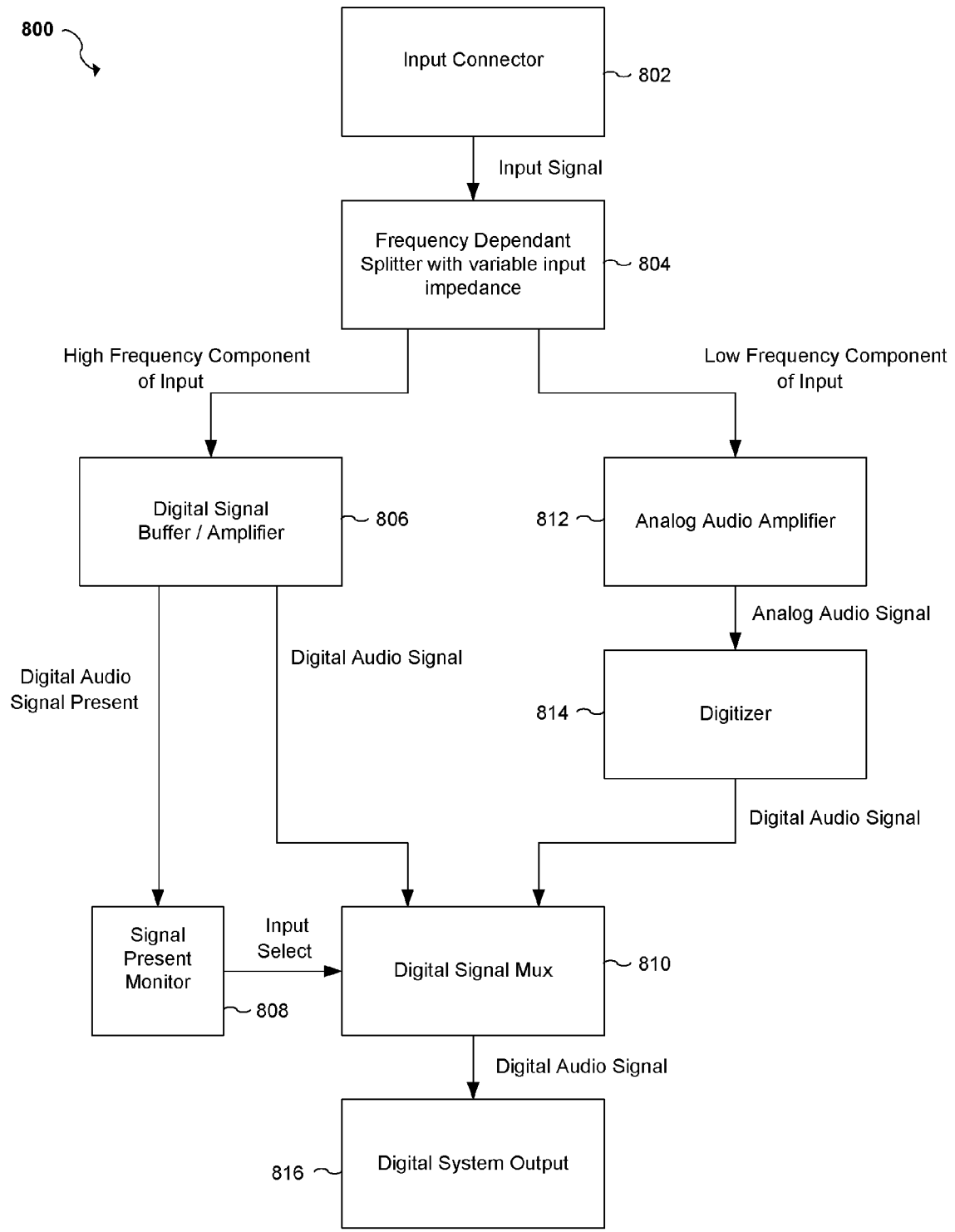
FIG. 8 is a block diagram illustrating a sixth system for receiving analog and digital audio input in accordance with an embodiment of the present invention.
Figure 9:
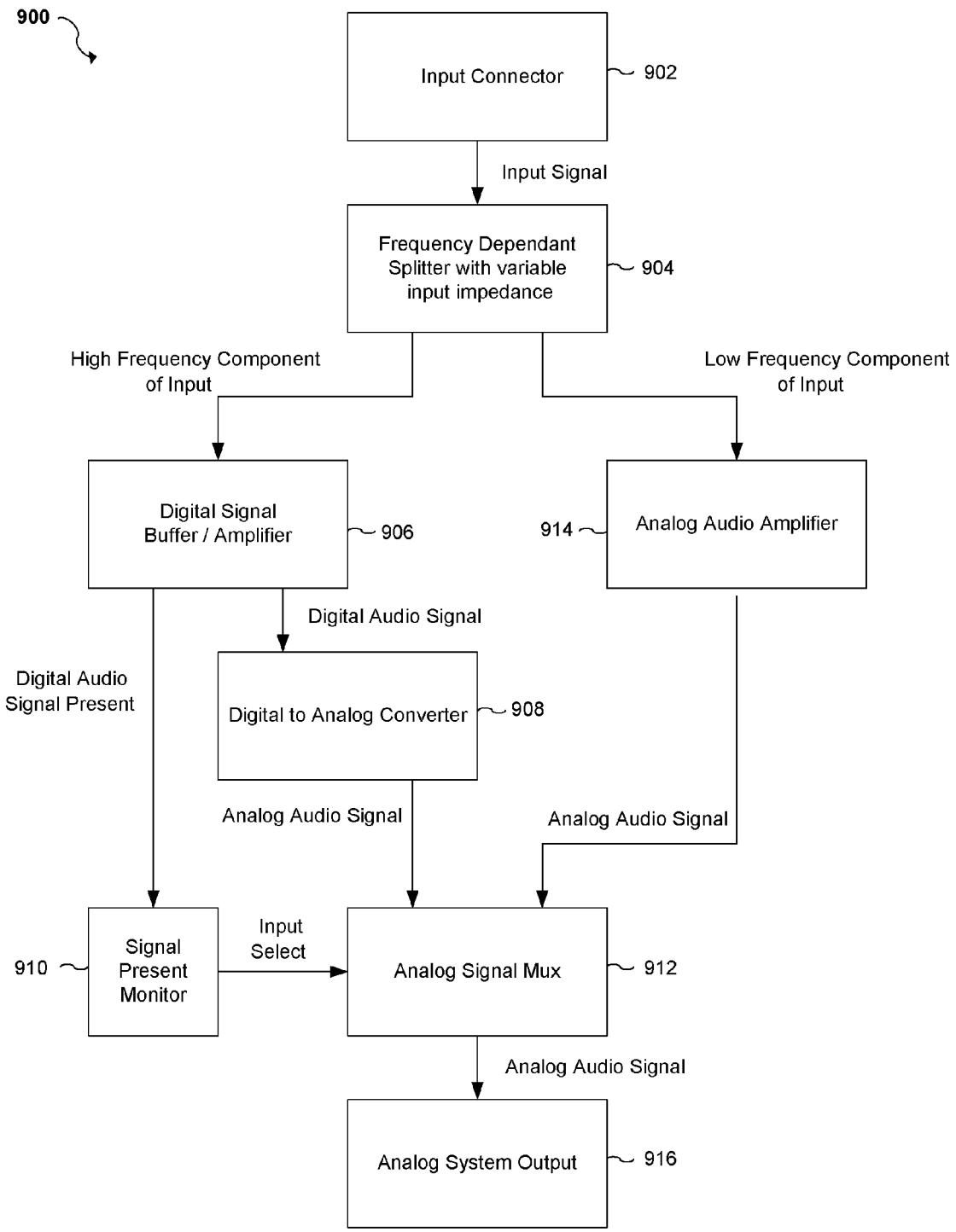
FIG. 9 is a block diagram illustrating a seventh system for receiving analog and digital audio input in accordance with an embodiment of the present invention.

In other embodiments of the present invention, a digital signal presence detection and automation of the signal selection multiplexer is presented. This automation removes the manual configuration requirement that exists in the prior art. Further, the use of a monitor that checks to determine if a valid digital signal is present and, if it is, configures the output multiplexer to select the digital input path is important. Otherwise, the analog input path could be selected by default. FIGS. 8 and 9 illustrate different embodiments providing such functionality.

Referring to FIG. 8, a block diagram illustrating a sixth system for receiving analog and digital audio input in accordance with an embodiment of the present invention is shown. According to this embodiment, the system 800 produces a final output that is digital by digitizing the analog audio path. A frequency dependant splitter with variable input impedance 804 receives an input signal from an input connector 802. The output of the frequency dependant splitter with variable input impedance 804 includes a high frequency component of the input and/or a low frequency component of the input. The high frequency component of the input is received by a digital signal buffer/amplifier 806 which outputs a digital audio signal to a signal present monitor 808 which outputs an input select signal and is received by a digital signal multiplexer 810. The low frequency component of the input is received by an analog audio amplifier 812 which outputs an analog audio signal to a digitizer 814. The digitizer 814 outputs a digital audio signal to the digital signal multiplexer 810 which outputs a digital audio signal to a digital system output 816.

Referring to FIG. 9, a block diagram illustrating a seventh system for receiving analog and digital audio input in accordance with an embodiment of the present invention is shown. According to this embodiment, the system 900 produces an output that is analog by converting the digital input to an analog signal. A frequency dependant splitter with variable input impedance 904 receives an input signal from an input connector 902. The output of the frequency dependant splitter with variable input impedance 904 includes a high frequency component of the input and/or a low frequency component of the input. The high frequency component of the input is received by a digital signal buffer/amplifier 906 which outputs a digital audio signal to a signal present monitor 910 which outputs an input select signal, and to a digital to analog converter 908 which outputs an analog audio signal. The input select signal and the analog audio signal are received by an analog signal multiplexer 912. The low frequency component of the input is received by an analog audio amplifier 914 which outputs an analog audio signal to the analog signal multiplexer 912 which outputs an analog audio signal to an analog system output 916.

The present invention provides numerous advantages over the prior art, including, without limitation, improved reliability, reduced noise, reduced physical size, automated functionality, reduced cost. For instance, the present invention is more reliable than manual switches in the prior art which can break. Manual switches also have a tendency to cause noise due to oxidation on the contact and unlike the present invention must be manually switched between analog and digital input. The present invention requires fewer internal circuits than the prior art and thus provides reduced physical size and cost. Further, the present invention receives analog and digital inputs via a single connector which eliminates or at least reduces the need for duplicate analog and digital cables. Additionally, because the present invention automatically handles analog and digital inputs via a single connector, a user does not need to know the type of signal being connected.

Systems, methods, devices and computer readable media have been shown and/or described in the above embodiments for universal browsing. Although the above descriptions set forth preferred embodiments, it will be understood that there is no intent to limit the embodiment of the disclosure by such disclosure, but rather, it is intended to cover all modifications and alternate implementations falling within the spirit and scope of the embodiment of the disclosure. For example, the present embodiments of the disclosure should not be limited to one of the depicted blocks or modules. Lastly, the embodiments are intended to cover capabilities and concepts whether they be via a loosely coupled set of components or they be converged into one or more integrated components, devices, circuits, and/or software programs.

The present invention thus includes a computer program which may be hosted on a storage medium and includes instructions which perform the processes set forth in the present specification. The storage medium can include, but is not limited to, any type of disk including floppy disks, optical disks, CD-ROMs, magneto-optical disks, ROMs, RAMs, EPROMs, EEPROMs, flash memory, magnetic or optical cards, or any type of media suitable for storing electronic instructions.

Obviously, many other modifications and variations of the present invention are possible in light of the above teachings. The specific embodiments discussed herein are merely illustrative, and are not meant to limit the scope of the present invention in any manner. It is therefore to be understood that within the scope of the disclosed concept, the invention may be practiced otherwise then as specifically described.

The invention claimed is:

1. A method for receiving analog and digital audio input via a single audio input connector, comprising:
   receiving an input signal from a single audio input connector;
   splitting the received input signal into a first input signal and a second input signal;
   filtering the first input signal to pass a digital signal;
   filtering the second input signal to pass an analog signal;
   digitizing the analog signal; and
   multiplexing the digital signal and the digitized analog signal.

2. The method of claim 1, further comprising amplifying the digital signal.

3. The method of claim 1, further comprising amplifying the digitized analog signal.

4. The method of claim 1, wherein the digitizing of the filtered analog signal is by a digitizer.

5. The method of claim 1, wherein the filtering of the first input signal is by a high pass filter.

6. The method of claim 1, wherein the filtering of the first input signal is by a low impedance filter.

7. The method of claim 1, wherein the filtering of the second input signal is by a low pass filter.

8. The method of claim 1, wherein the filtering of the second input signal is by a high impedance filter.

9. A system for receiving analog and digital audio input via a single audio input connector, comprising:
   a single audio input connector that receives an input signal;
   a low impedance filter that filters the input signal to pass digital signal components of the input signal, wherein the low impedance filter is communicably connected to the single audio input connector;
   a high impedance filter that filters the input signal to pass analog signal components of the input signal, wherein the high impedance filter is communicably connected to the single audio input connector;
   a digitizer that digitizes the high impedance filtered analog signal components, wherein the digitizer is communicably connected to the high impedance filter; and
   a multiplexer that multiplexes the low impedance filtered digital signal components and the digitized high impedance filtered analog signal components, wherein the multiplexer is communicably connected to the low impedance filter and the multiplexer is communicably connected to the digitizer.

10. The system of claim 9, further comprising a digital amplifier that amplifies the passed digital signal components, wherein the digital amplifier is communicably connected to the low impedance filter.

11. The system of claim 9, further comprising a digital amplifier that amplifies the digitized high impedance filtered analog signal components, wherein the digital amplifier is communicably connected to the high impedance filter.

12. The system of claim 9, wherein the low impedance filter is a high pass filter.

13. The system of claim 12, wherein the low impedance filter filters digital signals having a frequency greater than around 100 KHz.

14. The system of claim 9, wherein the high impedance filter is a low pass filter.

15. The system of claim 14, wherein the high impedance filter filters analog signals having a frequency less than around 100 kHz.

16. A system for receiving analog and digital audio input via a single audio input connector, comprising:
   a single audio input connector that receives an input signal;

a high frequency filter that filters the input signal to pass digital signal components of the input signal having a frequency greater than around 100 KHz, wherein the high frequency filter is communicably connected to the single audio input connector;

a digital amplifier that amplifies the high frequency filtered digital signal components, wherein the digital amplifier is communicably connected to the high frequency filter;

low frequency filter that filters the input signal to pass analog signal components of the input signal components having a frequency up to around 100 kHz, wherein the low frequency filter is communicably connected to the single audio input connector;

a digitizer that digitizes the low frequency filtered analog signal components, wherein the digitizer is communicably connected to the low frequency filter; and a multiplexer that multiplexes the high frequency filtered digital signal components and the digitized low frequency filtered analog signal components, wherein the multiplexer is communicably connected to the digital amplifier and wherein the multiplexer is communicably connected to the digitizer.

17. The system of claim 16, wherein the high frequency filter is at least one selected from the group consisting of a high pass filter and a band pass filter.

18. The system of claim 16, wherein the high frequency filter is at least one selected from the group consisting of a passive filter and an active filter.

19. The system of claim 16, wherein the low frequency filter is at least one selected from the group consisting of a low pass filter and a band pass filter.

20. The system of claim 16, wherein the low frequency filter is at is at least one selected from the group consisting of a passive filter and an active filter.

* * * * *